US012581871B2

(12) United States Patent
Chang et al.

(10) Patent No.: US 12,581,871 B2
(45) Date of Patent: Mar. 17, 2026

(54) PHASE-CHANGE MATERIAL (PCM) RADIO FREQUENCY (RF) SWITCHING DEVICE WITH THIN SELF-ALIGNED DIELECTRIC LAYER

(71) Applicant: Taiwan Semiconductor Manufacturing Company, Ltd., Hsinchu (TW)

(72) Inventors: Kuo-Pin Chang, Hsinchu (TW); Hung-Ju Li, Hsinchu (TW); Yu-Wei Ting, Taipei (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 617 days.

(21) Appl. No.: 17/840,624

(22) Filed: Jun. 15, 2022

(65) Prior Publication Data
US 2023/0413691 A1     Dec. 21, 2023

(51) Int. Cl.
*H10N 70/20*        (2023.01)
*H10N 70/00*        (2023.01)

(52) U.S. Cl.
CPC ......... *H10N 70/231* (2023.02); *H10N 70/021* (2023.02); *H10N 70/063* (2023.02);
(Continued)

(58) Field of Classification Search
CPC ... H10N 70/861; H10N 70/231; H10N 70/021
See application file for complete search history.

(56) References Cited

U.S. PATENT DOCUMENTS 8,476,612 B2 *   7/2013   Peters ................. H10N 70/823
                                                                   438/102
9,368,720 B1 *   6/2016   Moon ................ H10N 70/8828
                          (Continued)

FOREIGN PATENT DOCUMENTS

TW          I349332 B     9/2011
TW      201823361 A      7/2018

OTHER PUBLICATIONS

First office action received in the counterpart Taiwan application 112122267, mailed on Feb. 26, 2024.

*Primary Examiner* — Mounir S Amer
(74) *Attorney, Agent, or Firm* — Kilpatrick Townsend & Stockton LLP

(57)                ABSTRACT

A phase-change material (PCM) switching device is provided. The PCM switching device includes: a base dielectric layer over a semiconductor substrate; a heater element embedded in the base dielectric layer, the heater element comprising a first metal element and configured to generate heat in response to a current flowing therethrough; a self-aligned dielectric layer disposed on the heater element, wherein the self-aligned dielectric layer comprises one of an oxide of the first metal element and a nitride of the first metal element, and the self-aligned dielectric layer is horizontally aligned with the heater element; a PCM region disposed on the self-aligned dielectric layer, wherein the PCM region comprises a PCM operable to switch between an amorphous state and a crystalline state in response to the heat generated by the heater element; and two metal pads electrically connected to the PCM region.

20 Claims, 9 Drawing Sheets

(52) U.S. Cl.
CPC ....... *H10N 70/823* (2023.02); *H10N 70/8613*
(2023.02); *H10N 70/8828* (2023.02); *H10N 70/8833* (2023.02)

(56) References Cited

U.S. PATENT DOCUMENTS

| | | | |
|---|---|---|---|
| 11,424,406 B2 * | 8/2022 | Lai ..................... | H10N 70/8833 |
| 2016/0380194 A1 | 12/2016 | Karpov et al. | |
| 2020/0058848 A1 * | 2/2020 | El-Hinnawy ...... | H10N 70/8613 |
| 2020/0091428 A1 * | 3/2020 | Rose ................. | H10N 70/8828 |
| 2023/0189667 A1 * | 6/2023 | Cheng ................ | H10N 70/063 |
| | | | 257/4 |
| 2024/0397733 A1 * | 11/2024 | Hsieh ................ | G11C 13/0069 |

* cited by examiner

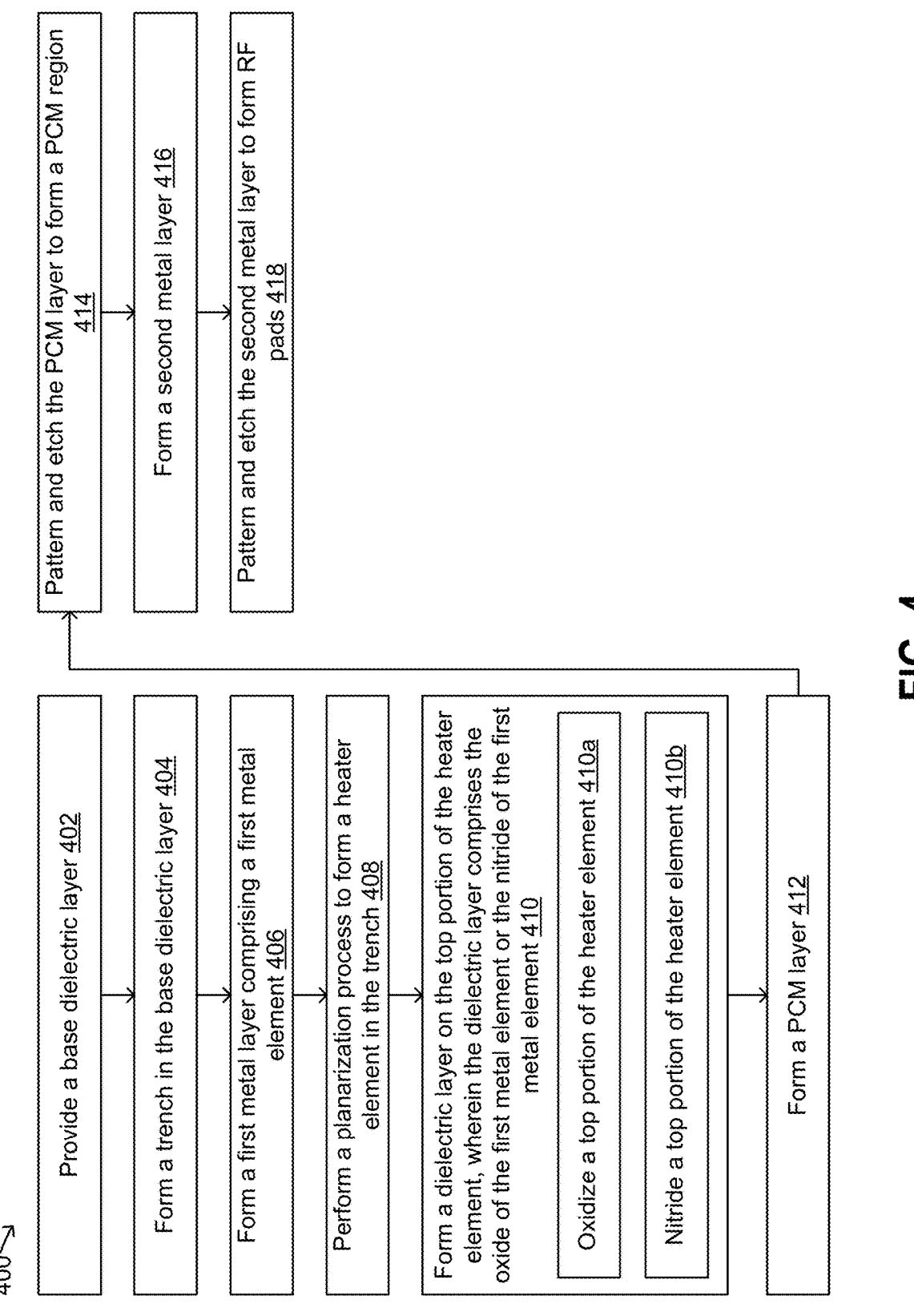

400

Provide a base dielectric layer 402

Form a trench in the base dielectric layer 404

Form a first metal layer comprising a first metal element 406

Perform a planarization process to form a heater element in the trench 408

Form a dielectric layer on the top portion of the heater element, wherein the dielectric layer comprises the oxide of the first metal element or the nitride of the first metal element 410

Oxidize a top portion of the heater element 410a

Nitride a top portion of the heater element 410b

Form a PCM layer 412

Pattern and etch the PCM layer to form a PCM region 414

Form a second metal layer 416

Pattern and etch the second metal layer to form RF pads 418

FIG. 4

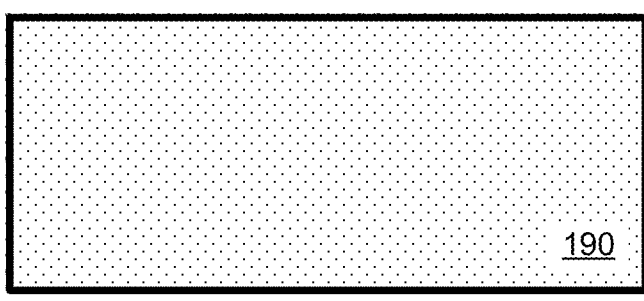
FIG. 5A
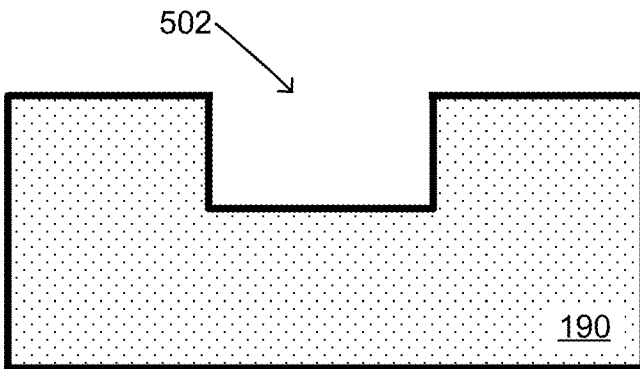
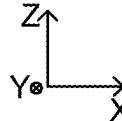
FIG. 5B

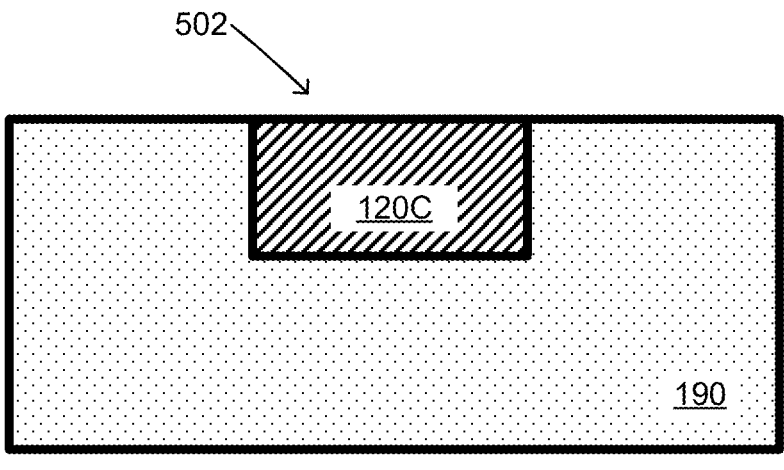
502
120C
190
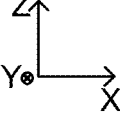
FIG. 5C
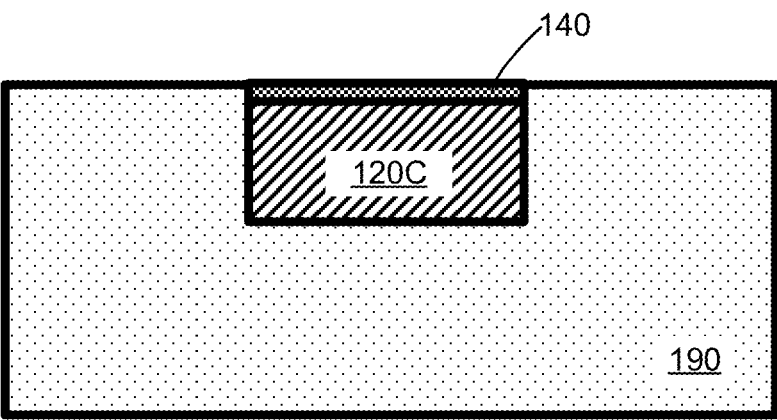
140
120C
190
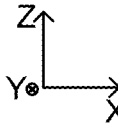
FIG. 5D

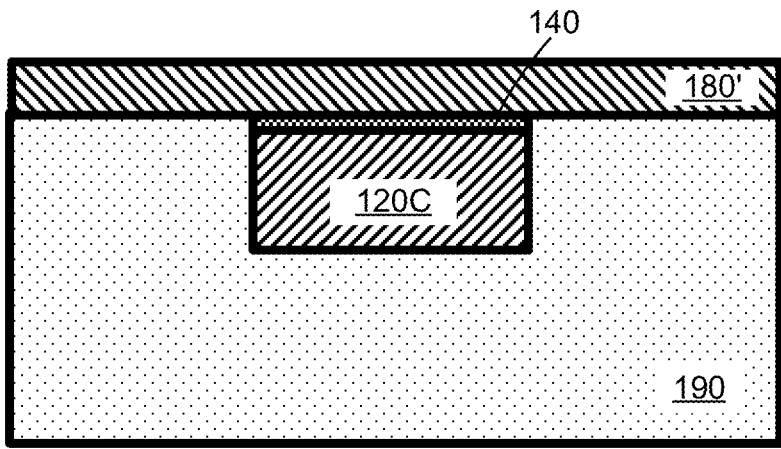
FIG. 5E
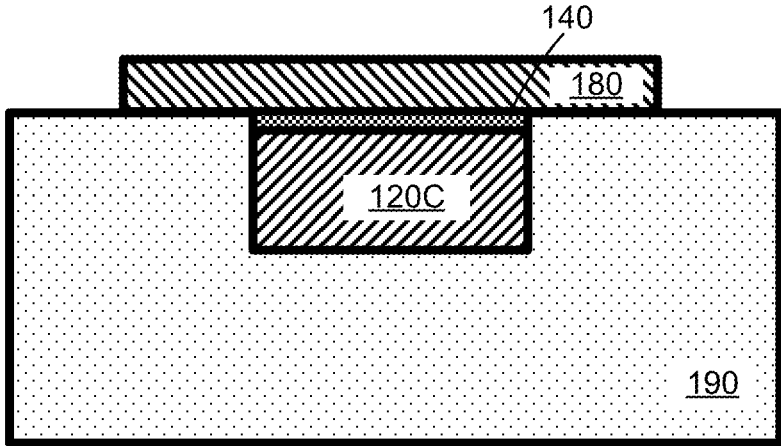
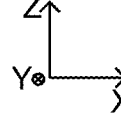
FIG. 5F

600

PHASE-CHANGE MATERIAL (PCM) RADIO FREQUENCY (RF) SWITCHING DEVICE WITH THIN SELF-ALIGNED DIELECTRIC LAYER

FIELD

Embodiments of the present disclosure relate generally to radio frequency (RF) devices, and more particularly to phase-change material (PCM) RF switching devices.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. There is always a need to improve the performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart diagram illustrating an example method for fabricating a PCM RF switch in accordance with some embodiments.

FIGS. 5A-5H are cross-sectional views of a portion of the PCM RF switch at various stages of fabrication in accordance with some embodiments.

DETAILED DESCRIPTION OF THE INVENTION

Figure 1A:
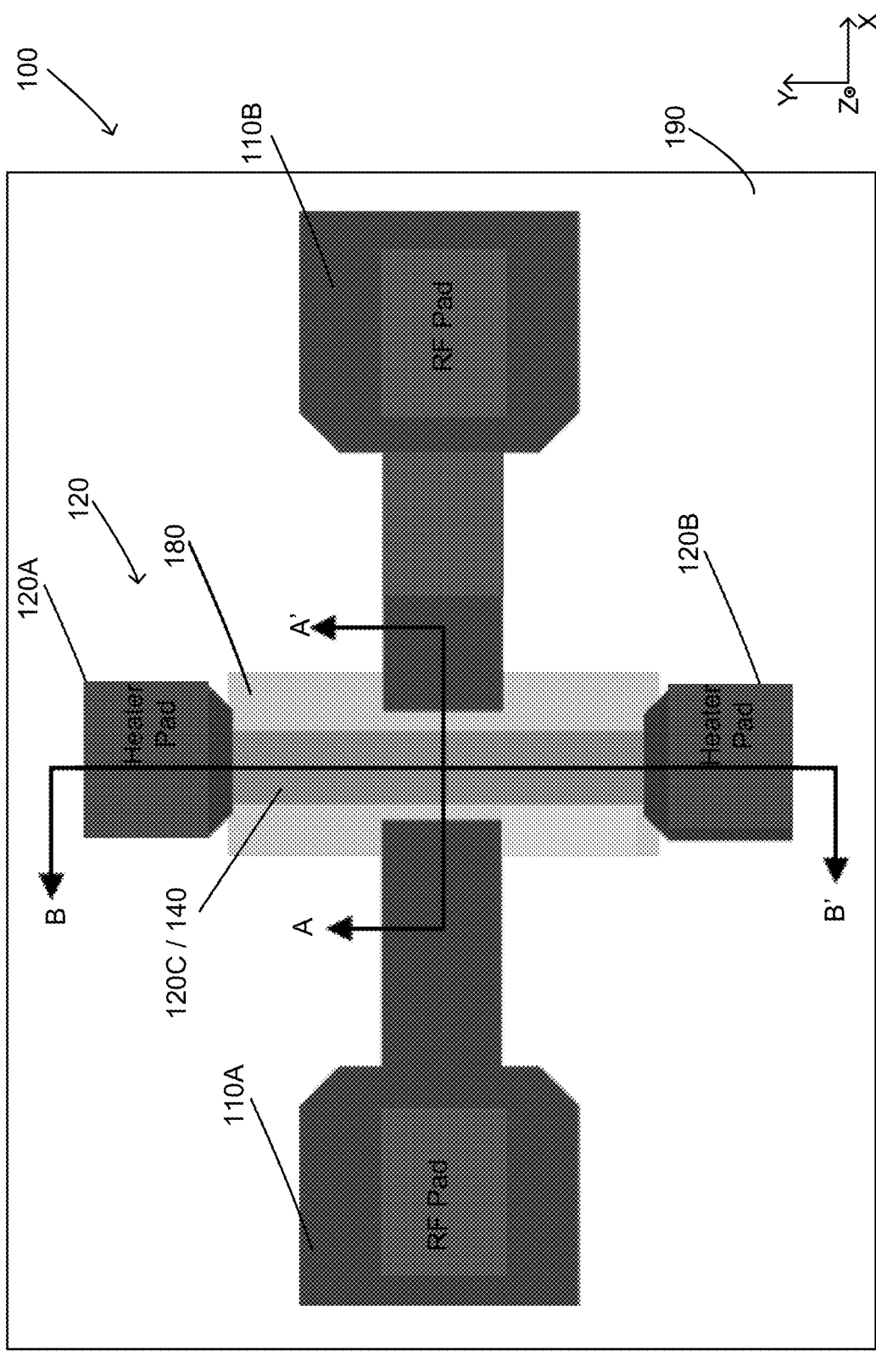
FIG. 1A is a diagram illustrating an example phase-change material (PCM) radio frequency (RF) switch in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

A radio frequency (RF) switch or a microwave switch (sometimes also referred to as an "RF switching device" or a "microwave switching device") is a device to route high-frequency signals through transmission paths. RF or microwave switches are used extensively in microwave test systems for signal routing between instruments and devices under test (DUT). In addition, RF switches are widely used in wireless communication.

A phase-change material (PCM) RF switch is a new type of RF switch. PCM RF switches operate based on the PCM switching mechanism. The PCM switching mechanism is a mechanism of reversible switching of a PCM between resistive states, i.e., an amorphous OFF state (i.e., a high resistance state) and a crystalline ON state (i.e., a low resistance state). The reversible switching is enabled by changing the phase of the PCM, which includes a structure that may change phase between amorphous and crystalline based on, for example, temperature change sequences via joule heating. Joule heating involves the heat that is produced during the flow of an electric current through, for example, a conductive material. As the PCM changes phase from crystalline to amorphous, for example, due to heating and cooling sequences controlled by, for example, applied voltage biases from the control circuitry, the resistance of the PCM changes from low to high, respectively. Accordingly, a PCM RF switch can be turned on or off by switching between the high resistance state and the low resistance state.

Joule heating is typically controlled by temperature pulses (implemented by current pulses) with the desired pulse width and the desired falling time. In the reset operation (i.e., changing from the amorphous state to the crystalline state), a high current is used to raise the temperature of the PCM above its melting temperature, with a fast cooling (i.e., a short falling time) to quench the PCM to prevent re-crystallization. In the set operation (i.e., changing from the crystalline state to the amorphous state), a medium current is used to raise the temperature of the PCM above its crystallization temperature but below its melting temperature. The pulse width is relatively long for nucleation formation, while the falling time is relatively long for crystal growth.

In some implementations, a dielectric layer, such as a silicon nitride (SiN) layer, is inserted between the PCM and a heater element to insulate the heater element and the PCM and prevent phase segregation (i.e., change in PCM composition) after multiple cycles. Therefore, the Joule heating is indirect heating because of the presence of the silicon nitride layer. Indirect heating requires more power for switching. Thus, the efficiency of thermal transmission is important.

Adding the silicon nitride layer increases the fabrication cost due to extra processing step(s). Moreover, the silicon nitride layer typically has a larger area than the heater element (i.e., extending horizontally beyond the heater element), and a portion of the heat that is generated by the heater element during the write operation is dissipated laterally instead of vertically. Thus, there is lateral thermal loss, and the power consumption during the write operation increases. The efficiency of thermal distribution is compromised. Lastly, the extended silicon nitride layer also results in a large parasitic capacitance. A large parasitic capacitance negatively impacts the isolation in the OFF state (i.e., the attenuation of the undesired signal in the OFF state) of the PCM RF switch.

In accordance with some aspects of the disclosure, a phase-change material (PCM) switching device is provided. A heater element is embedded in the base dielectric layer and configured to generate heat in response to a current flowing therethrough. The heater element comprises a first metal element. A self-aligned dielectric layer is formed on the heater element. The self-aligned dielectric layer comprises either an oxide of the first metal element or a nitride of the first metal element. The self-aligned dielectric layer is horizontally aligned with the heater element.

In some implementations, the self-aligned dielectric layer is formed by oxidizing or nitriding a top portion of the heater element. Therefore, the self-aligned dielectric layer can be thinner as compared to the conventional dielectric layer (e.g., a silicon nitride layer) deposited on the heater element. In addition, the self-aligned dielectric layer is intrinsically self-aligned with the heater element horizontally. The small thickness in the vertical direction and the self-alignment in the horizontal plane can result in the following advantages.

First, the volume of the self-aligned dielectric layer is smaller than the conventional dielectric layer deposited on the heater element. As a result, less heat generated by the heater element is absorbed by the self-aligned dielectric layer.

Second, lateral thermal dissipation is suppressed. Accordingly, the intended thermal transmission in the vertical direction is more concentrated or focused, and the thermal transmission efficiency is further increased. The power needed during the write operation is reduced accordingly.

Third, the off-state capacitance is reduced. A portion of the region between the heater element and the RF pads is occupied by the base dielectric layer made of, for example, silicon dioxide (characterized by a relatively low dielectric constant of 3.9) instead of the silicon nitride layer made of silicon nitride (characterized by a relatively high dielectric constant of 7 to 8) in a conventional PCM RF switch, the off-state capacitance is reduced. Thus, the isolation of the PCM RF switch is improved.

Fourth, the fabrication cost is reduced. Because the self-aligned dielectric layer is formed by oxidizing or nitriding a top portion of the heater element, the fabrication cost is reduced due to, for example, fewer masks.

Example PCM RF Switch

Figure 1B:
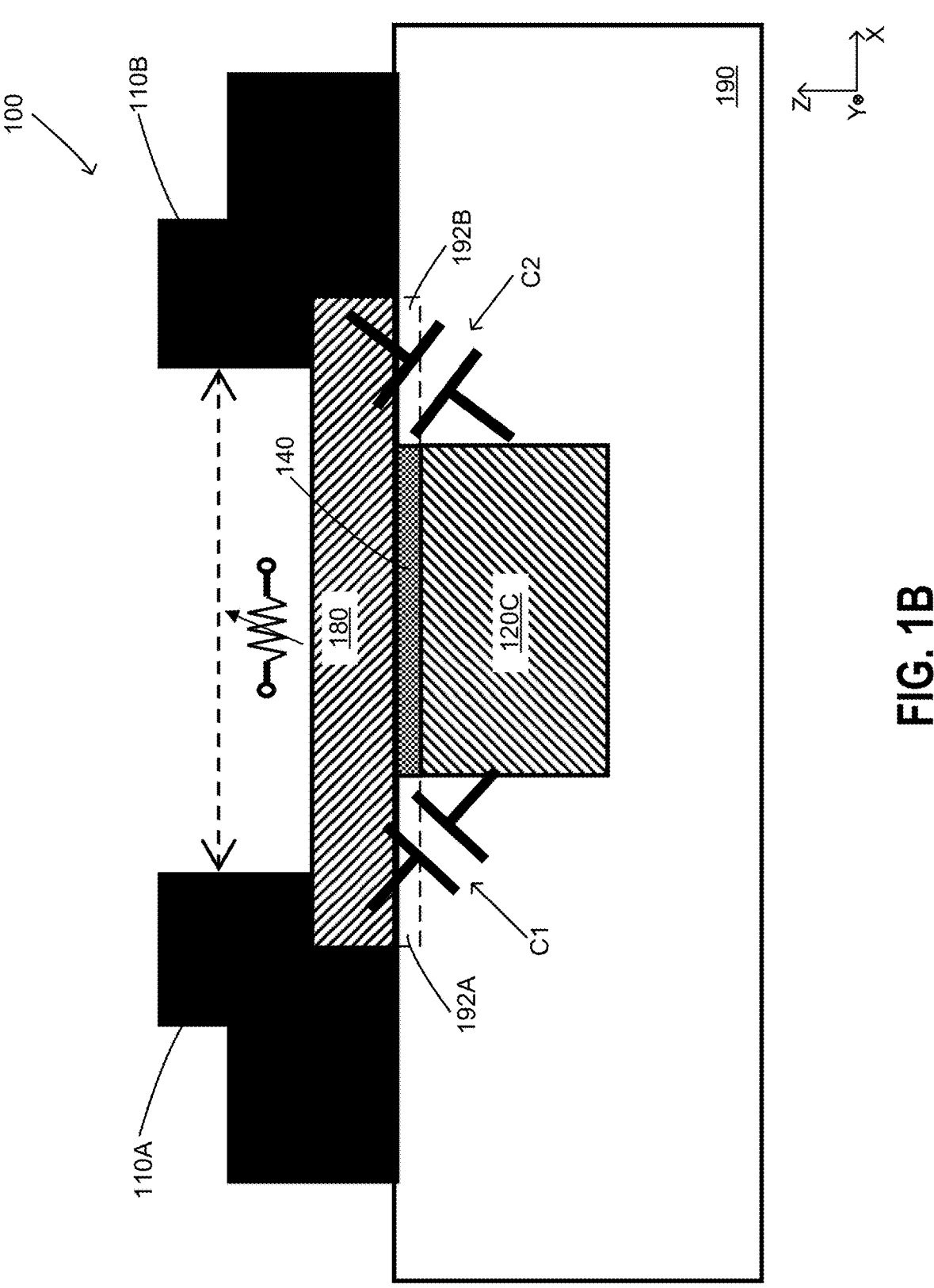
FIG. 1B is a diagram illustrating the cross-section, taken at A-A', of the PCM RF switch shown in FIG. 1A in accordance with some embodiments.

FIG. 1A is a diagram illustrating an example PCM RF switch 100 in accordance with some embodiments. FIG. 1A is a top-down plan view. FIG. 1B is a diagram illustrating the cross-section of the PCM RF switch 100 taken at A-A' in accordance with some embodiments. It should be understood that FIGS. 1A and 1B are not drawn to scale.

In the example shown in FIGS. 1A and 1B, the example PCM RF switch 100 includes, among other elements, a base dielectric layer 190, a heater structure 120, a self-aligned dielectric layer 140, a PCM region 180, two RF pads (sometimes also referred to as "metal pads") 110A and 110B. The heater structure 120 includes a heater element 120C and two heater pads 120A and 120B. It should be understood that the PCM RF switch 100 may include other components such as vias vertically connected to the RF pads 110A and 110B.

The heater element 120C is embedded in the base dielectric layer 190. In one embodiment, the base dielectric layer 190 comprises silicon dioxide. In other embodiments, the base dielectric layer 190 comprises other dielectric materials. In one implementation, the base dielectric layer 190 is an interlayer dielectric layer over a semiconductor substrate comprising, for example, silicon. In another implementation, the base dielectric layer 190 is a dielectric layer on the top surface of a semiconductor substrate comprising, for example, silicon. It should be understood that these embodiments and implementations are not intended to be limiting.

In the example shown in FIGS. 1A and 1B, the heater element 120C extends in a first horizontal direction (i.e., the Y-direction). The heater pads 120A and 120B are located at a first end and a second end of the heater element 120C, respectively. When a voltage is applied, electric current flows between the heater pads 120A and 120B through the heater element 120C. As mentioned above, the heat generated by the heater element 120C can be controlled by the electric current. The heat generated by the heater element 120C is transmitted, in a vertical direction (i.e., the Z-direction as shown in FIGS. 1A and 1B), to the PCM region 180 through the self-aligned dielectric layer 140. When the temperature of the PCM region 180 is above the melting temperature of the PCM region 180, the PCM region 180 changes from the crystalline state to the amorphous state and transforms to a high resistance state. When the temperature of the PCM region 180 is above the crystallization temperature, but below the melting temperature of the PCM region 180, the PCM region 180 changes from the amorphous state to the crystalline state and transforms into a low resistance state.

The self-aligned dielectric layer 140 is disposed on the top of the heater element 120C. The self-aligned dielectric layer 140 is sandwiched between the heater element 120C and the PCM region 180 in the Z-direction. As will be described in detail below with reference to FIG. 4, the self-aligned dielectric layer 140 is formed by oxidizing (i.e., performing an oxidation process) or nitriding (i.e., performing a nitridation process) a top portion of the heater element 120C. In one embodiment, the heater element 120C comprises a first metal element; the self-aligned dielectric layer 140 comprises the oxide of the first metal element. In another embodiment, the heater element 120C comprises a first metal element; the self-aligned dielectric layer 140 comprises the nitride of the first metal element.

Since the self-aligned dielectric layer 140 is formed by oxidizing or nitriding a top portion of the heater element 120C, the self-aligned dielectric layer 140 can be thinner as compared to the conventional dielectric layer (e.g., a silicon nitride layer) deposited on the heater element 120C. In addition, the self-aligned dielectric layer 140 is intrinsically self-aligned with the heater element 120C in the first horizontal direction (i.e., the Y-direction as shown in FIGS. 1A and 1B) and in the second horizontal direction perpendicular to the first horizontal direction (i.e., the X-direction as shown in FIGS. 1A and 1B). The small thickness in the Z-direction and the self-alignment in the X-Y plane can result in the following advantages.

First, the volume of the self-aligned dielectric layer 140 is smaller than the conventional dielectric layer deposited on the heater element 120C. As a result, less heat generated by the heater element 120C is absorbed by the self-aligned dielectric layer 140. The thermal transmission efficiency is increased. The power needed during the write operation is reduced accordingly.

Second, lateral thermal dissipation is suppressed. As shown in FIG. 1B, the self-aligned dielectric layer 140 is not formed at the regions 192A and 192B (shown in dashed line in FIG. 1B) due to the nature of the self-alignment between the self-aligned dielectric layer 140 and the heater element 120C. As a result, lateral thermal dissipation is suppressed. Accordingly, the intended thermal transmission in the vertical direction is more concentrated or focused, and the thermal transmission efficiency is further increased. The power needed during the write operation is reduced accordingly.

Third, the off-state capacitance $C_{off}$ is reduced. As shown in FIG. 1B, the off-state capacitance $C_{off}$ can be regarded as two capacitors C1 and C2 connected in parallel. For each of the capacitors C1 and C2, the capacitance is determined by the materials between the RF pad 110A/110B and the heater element 120C. Since the regions 192A and 192B are occupied by the base dielectric layer 190 made of silicon dioxide (characterized by a relatively low dielectric constant of 3.9) instead of the silicon nitride layer made of silicon nitride (characterized by a relatively high dielectric constant of 7 to 8) in a conventional PCM RF switch, the capacitance of the capacitors C1 and C2 is reduced. Accordingly, the off-state capacitance Collis reduced, and the isolation of the PCM RF switch 100 is improved.

Fourth, the fabrication cost is reduced. Because the self-aligned dielectric layer 140 is formed by oxidizing or nitriding a top portion of the heater element 120C, the fabrication cost is reduced due to, for example, fewer masks.

The PCM region 180 is disposed on the base dielectric layer 190 and the self-aligned dielectric layer 140. As explained above, the resistive states of the PCM region 180 can go through reversible switching between amorphous and crystalline. As the PCM region 180 changes phase between crystalline and amorphous, the PCM RF switch is turned on or turned off accordingly.

In some examples, the PCM region 180 comprises one or more layers of a binary system of Ga—Sb, In—Sb, In—Se, Sb—Te, Ge—Te, and Ge—Sb; a ternary system of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—

Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. In one embodiment, the PCM of the PCM region 180 comprises germanium telluride (GeTe). In one embodiment, the PCM of the PCM region 180 comprises antimony telluride ($Sb_2Te_3$). It should be understood that these materials are exemplary rather than limiting. In some implementations, the PCM region 180 is formed by chemical vapor deposition (CVD), physical vapor deposition (PVD), pulsed laser deposition (PLD), sputtering, atomic layer deposition (ALD), or any other suitable thin film deposition processes.

The phase transition between the crystalline phase and the amorphous phase of the PCM region 180 is related to the interplay between the long-range order and the short-range order of the structure of the material of the PCM region 180. For example, the collapse of the long-range order generates the amorphous phase. The long-range order in the crystalline phase facilitates electrical conduction, while the amorphous phase impedes electrical conduction and results in high electrical resistance. To tune the properties of the PCM region 180 for different needs, the material of the PCM region 180 may be doped with various elements at different amounts to adjust the proportion of the short-range order and the long-range order inside the bonding structure of the material. The doped element may be an element used for semiconductor doping through the use of, for example, ion implantation or diffusion.

The RF pads 110A and 110B are disposed on the base dielectric layer 190 and the PCM region 180. As shown in FIG. 1B, each of the RF pads 110A and 110B is in contact with the PCM region 180 at a top side and a lateral side of the PCM region 180. Therefore, there is an electrical path (i.e., the read path) from the RF pad 110A, through the PCM region 180, to the RF pad 110B. The read path is separated from the write path. When the PCM region 180 is in the amorphous state, the electrical path is cut off, and the PCM RF switch 100 is turned off. When the PCM region 180 is in the crystalline state, the electrical path is created, and the PCM RF switch 100 is turned on. The resistance in the on-state (i.e., Ron) is represented by a resistor symbol shown in FIG. 1B.

Figure 2:
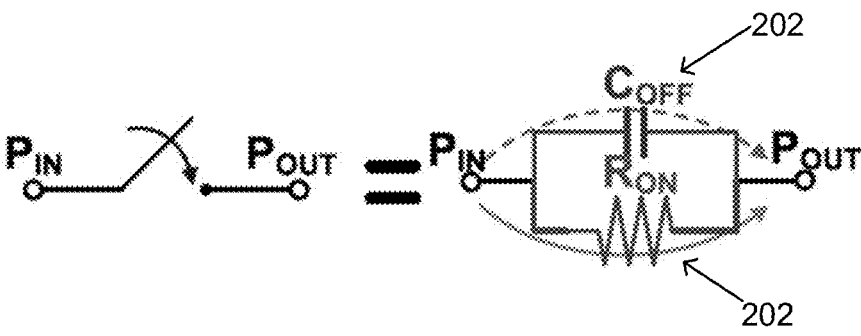
FIG. 2 is a schematic diagram illustrating the operation of the PCM RF switch 100 shown in FIGS. 1A and 1B in accordance with some embodiments.

FIG. 2 is a schematic diagram illustrating the operation of the PCM RF switch 100 shown in FIGS. 1A and 1B in accordance with some embodiments. As shown in FIG. 2, the PCM RF switch 100 is equivalent to an on-state resistor 202 and an off-state capacitor 204 connected in parallel. The insertion loss is the ratio of the output power ($P_{out}$) at the output port (e.g., the RF pad 110B) to the input power ($P_{in}$) at the input port (e.g., the RF pad 110A) when the PCM RF switch 100 is turned on. For example, when the output power ($P_{out}$) is 9.5 W, and the input power is 10 W, the insertion loss is 10*log (9.5/10) dB=−0.2 dB. The isolation is the attenuation of the undesired signal, i.e., the ratio of the output power ($P_{out}$) to the input power ($P_{in}$), when the PCM RF switch 100 is turned off. For example, when the output power ($P_{out}$) is 0.1 W, and the input power is 10 W, the isolation is 10*log (0.1/10) dB=−20 dB. The insertion loss is related to the on-state resistance Ron of the on-state resistor 202, while the isolation is related to the off-state capacitance $C_{off}$ of the off-state capacitor 204.

Choice of Materials

Figure 3:
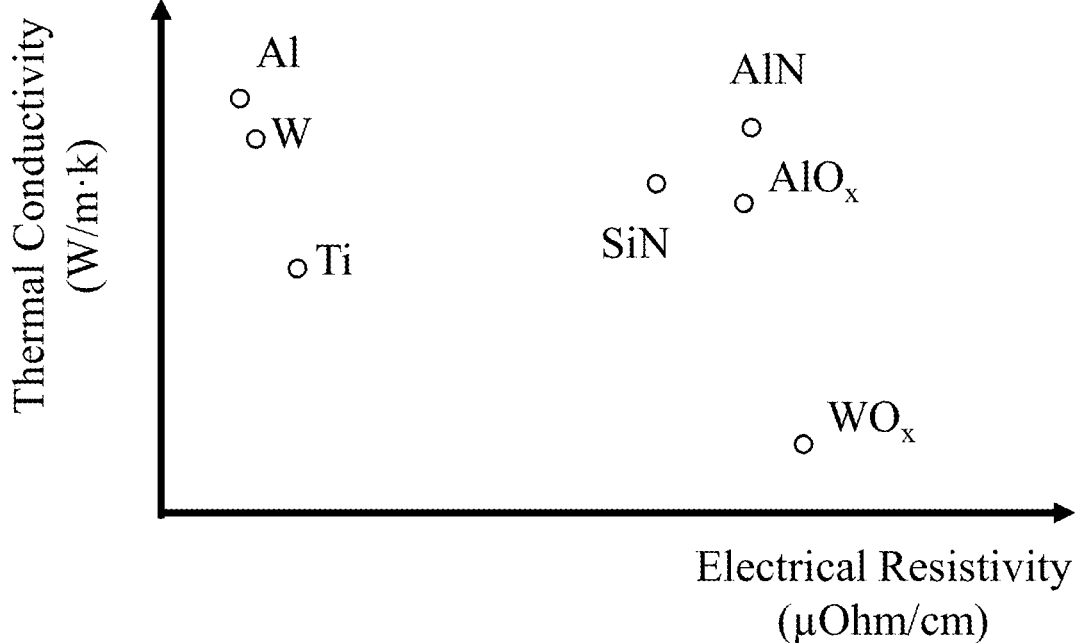
FIG. 3 is a diagram illustrating the electrical resistivity and the thermal conductivity of various metals and corresponding oxide or nitride in accordance with some embodiments.

FIG. 3 is a diagram illustrating the electrical resistivity and the thermal conductivity of various metals and their oxide or nitride in accordance with some embodiments. It is advantageous that the material of the heater element 120C is characterized by a relatively high thermal conductivity and a relatively low electrical resistivity. The relatively high thermal conductivity contributes to better thermal transmission efficiency, whereas the relatively low electrical resistivity contributes to a higher write operation efficiency. In other words, the candidate materials are in the top left corner of the diagram.

In the meantime, since the self-aligned dielectric layer 140 is either the oxide or the nitride of the material of the heater element 120C, it is advantageous that the corresponding oxide or nitride is characterized by a relatively high thermal conductivity and a relatively high electrical resistivity. The relatively high thermal conductivity contributes to better thermal transmission efficiency, whereas the relatively high electrical resistivity contributes to better insulation between the PCM region 180 and the heater element 120C. In other words, the oxide or the nitride of the candidate materials are in the top right corner of the diagram.

Under this analysis framework, the candidate materials of the heater element 120C include tungsten (W), titanium (Ti), aluminum (Al), and tantalum (Ta), whereas the candidate materials of the self-aligned dielectric layer 140 include the oxide or nitride thereof, including tungsten trioxide ($WO_3$), titanium dioxide ($TiO_2$) or titanium oxide (TiO), aluminum oxide ($Al_2O_3$), aluminum nitride (AlN), and tantalum oxide ($TaO_x$). In one example, the heater element 120C comprises tungsten (W), and the self-aligned dielectric layer 140 comprises tungsten trioxide ($WO_3$). In another example, the heater element 120C comprises titanium (Ti), and the self-aligned dielectric layer 140 comprises titanium dioxide ($TiO_2$).

Example Process Flow

FIG. 4 is a flowchart diagram illustrating an example method 400 for fabricating a PCM RF switch in accordance with some embodiments. In the example shown in FIG. 4, the method 400 includes operations 402, 404, 406, 408, 410, 412, 414, 416, and 418. Additional operations may be performed. Also, it should be understood that the sequence of the various operations discussed above with reference to FIG. 4 is provided for illustrative purposes, and as such, other embodiments may utilize different sequences. These various sequences of operations are to be included within the scope of embodiments. FIGS. 5A-5H are cross-sectional views of a portion of the PCM RF switch at various stages of fabrication in accordance with some embodiments.

The method 400 starts with operation 402. At operation 402, a base dielectric layer is provided. In one implementation, the base dielectric layer is an interlayer dielectric layer over a semiconductor substrate comprising, for example, silicon. In another implementation, the base dielectric layer is a dielectric layer on the top surface of a semiconductor substrate comprising, for example, silicon. It should be understood that these implementations are not intended to be limiting.

In the example shown in FIG. 5A, the base dielectric layer 190 is provided. In one embodiment, the base dielectric layer 190 comprises silicon dioxide characterized by a relatively low thermal conductivity (about 1.4 W/(mK)), which is beneficial for thermal confinement. In other embodiments, the base dielectric layer 190 comprises other dielectric materials.

At operation 404, a trench is formed in the base dielectric layer. In one implementation, the trench is formed by patterning, using photolithography, a photoresist layer on the top surface of the base dielectric layer 190, followed by etching the exposed region of the base dielectric layer.

In the example shown in FIG. 5B, a trench 502 is formed in the base dielectric layer 190. The trench 502 has a depth in the Z-direction and a width in the X-direction. In one example, the trench 502 is elongated and extends in the Y-direction.

At operation 406, a first metal layer is formed, and the first metal layer comprises a first metal element. The first metal layer fills the trench formed at operation 404. There is an excess portion of the first metal layer outside the trench. In one embodiment, the first metal element is tungsten (W). In another embodiment, the first metal element is titanium (Ti). In yet another embodiment, the first metal element is aluminum (Al). In still another embodiment, the first metal element is tantalum (Ta).

At operation 408, a planarization process is performed to remove the excess portion of the first metal layer that is outside the trench. Thus, a heater element is formed in the trench. In one embodiment, the planarization process is a chemical-mechanical polishing (CMP) process.

In the example shown in FIG. 5C, the heater element 120C is formed in the trench 502 after operations 406 and 408. The heater element 120C is embedded in the base dielectric layer 190.

At operation 410, a (self-aligned) dielectric layer is formed on the top portion of the heater element. The dielectric layer is self-aligned with the heater element formed in the trench.

In one embodiment, the dielectric layer comprises the oxide of the first metal element. In one example, the dielectric layer comprises tungsten trioxide ($WO_3$). In another example, the dielectric layer comprises titanium dioxide ($TiO_2$) or titanium oxide (TiO). In yet another example, the dielectric layer comprises aluminum oxide ($Al_2O_3$). In still another example, the dielectric layer comprises tantalum oxide ($TaO_x$). It should be understood that these examples are exemplary, and other materials may be employed as needed.

In another embodiment, the dielectric layer comprises the nitride of the first metal element. In one example, the dielectric layer comprises aluminum nitride (AlN). It should be understood that these examples are exemplary, and other materials may be employed as needed.

In one implementation, operation 410 includes oxidizing a top portion of the heater element (operation 410a shown in FIG. 4). In one embodiment, operation 410a is achieved using an (oxygen-containing) plasma treatment process. The plasma treatment process includes treating the structure in oxygen gas flowing at a rate ranging from, for example, about 100 standard cubic centimeter per minute (sccm) to about 500 sccm for a time period ranging from, for example, about 1 second to about 60 seconds in an, for example, reactive-ion etching (RIE) chamber. The plasma treatment may be carried out under a pressure ranging from, for example, about 10 mTorr to about 100 mTorr, at a temperature ranging from, for example, about 10° C. to about 100° C., and at an RF power ranging from, for example. about 500 W to about 800 W. The plasma treatment oxidizes the heater element from its top surface to a depth of, for example, about 1 nm to about 2 nm. In another embodiment, operation 410a is achieved using a wet oxidation process. In one example, $H_2O$ vapor or steam is introduced into a chamber or container to provide the oxygen source.

In another implementation, operation 410 includes nitriding a top portion of the heater element (operation 410b shown in FIG. 4). In one embodiment, operation 410b is achieved using a (nitrogen-containing) plasma treatment process. The plasma treatment process includes treating the structure in nitrogen gas flowing at a rate ranging from, for example, about 100 sccm to about 500 sccm for a time period ranging from, for example, about 1 second to about 60 seconds in an, for example, reactive-ion etching (RIE) chamber. The plasma treatment may be carried out under a pressure ranging from, for example, about 10 mTorr to about 100 mTorr, at a temperature ranging from, for example, about 10° C. to about 100° C., and at an RF power ranging from, for example, about 500 W to about 800 W. The plasma treatment nitrides the heater element from its top surface to a depth of, for example, about 1 nm to about 2 nm. In another embodiment, operation 410$b$ is achieved using a wet nitridation process. In one example, nitrogen is introduced into a chamber or container to provide the nitrogen source.

In the example shown in FIG. 5D, the self-aligned dielectric layer 140 is formed on the top portion of the heater element 120C. As explained above, a top portion of the heater element 120C is oxidized in some implementations. In other implementations, a top portion of the heater element 120C is nitrided.

At operation 412, a PCM layer is formed on the top of the top surface of the base dielectric layer and on the (self-aligned) dielectric layer. As mentioned above, the PCM layer may comprise one or more layers of a binary system of Ga—Sb, In—Sb, In—Se, Sb—Te, Ge—Te, and Ge—Sb; a ternary system of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. It should be understood that these materials are exemplary rather than limiting.

In some implementations, the PCM layer is formed by chemical vapor deposition (CVD), physical vapor deposition (PVD), pulsed laser deposition (PLD), sputtering, atomic layer deposition (ALD), or any other suitable thin film deposition processes.

In the example shown in FIG. 5E, the PCM layer 180' is formed on the self-aligned dielectric layer 140 and on the top surface of the base dielectric layer 190.

At operation 414, the PCM layer is patterned and etched to form a PCM region. In one implementation, a photoresist layer formed on the PCM layer is formed at operation 412 and then patterned, using photolithography, and the exposed region of the PCM layer is etched subsequently.

In the example shown in FIG. 5F, the PCM region 180 is formed after patterning and etching the PCM layer 180' shown in FIG. 5E. As shown in FIG. 5F, the PCM region 180 is characterized by a larger width in the X-direction than that of the self-aligned dielectric layer 140 and the heater element 120C.

At operation 416, a second metal layer is formed. The second metal layer is formed on the PCM region 180 and the exposed area of the top surface of the base dielectric layer. The second metal layer comprises a second metal element. In some embodiments, the second metal element is the same as the first metal element. In other words, the second metal layer is made of the same metal as the heater element. In other embodiments, the second metal element is different from the first metal element. In other words, the second metal layer and the heater element are made of different materials.

In one example, the first metal element is tungsten (W). In another example, the first metal element is titanium (Ti). It should be understood that these examples are not intended to be limiting, and any suitable materials can be employed for the second metal layer.

In some implementations, the second metal layer is formed by chemical vapor deposition (CVD), physical vapor deposition (PVD), pulsed laser deposition (PLD), sputtering, atomic layer deposition (ALD), or any other suitable processes.

Figure 5G:
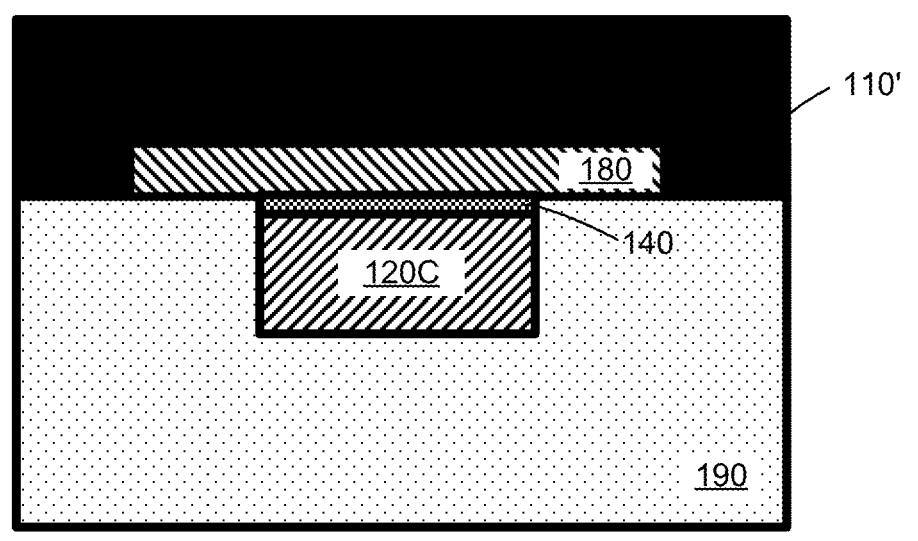

In the example shown in FIG. 5G, the second metal layer 110' is formed. The second metal layer 110' encapsulates the PCM region 180.

At operation 418, the second metal layer is patterned and etched to form two RF pads.

In one implementation, a photoresist layer formed on the second metal layer is formed at operation 416 and then patterned, using photolithography, and the exposed region of the second metal layer is etched subsequently.

Figure 5H:
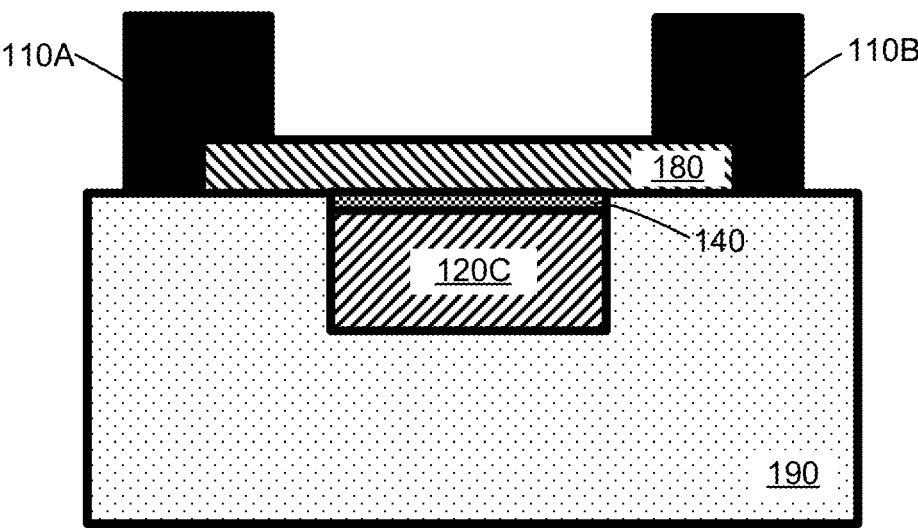

In the example shown in FIG. 5H, the RF pads 110A and 110B are formed after patterning and etching the second metal layer 110' shown in FIG. 5G. As shown in FIG. 5H, the RF pads 110A and 110B are disposed on a portion of the base dielectric layer 190 and a portion of the PCM region 180. Each of the RF pads 110A and 110B is in contact with the PCM region 180 at a top side and a lateral side of the PCM region 180. Therefore, an electrical path (i.e., the read path) from the RF pad 110A, through the PCM region 180, to the RF pad 110B is created. The read path, which extends in the X-direction, is separated from the write path, which extends in the Y-direction.

It should be understood that additional operations may be employed in addition to operations 402 to 418. For example, an additional dielectric layer can be formed, patterned, and etched, and vias that are vertically connected to the RF pads 110A and 110B are subsequently formed in the additional dielectric layer.

Example Operation of the PCM RF Switch

Figure 6:
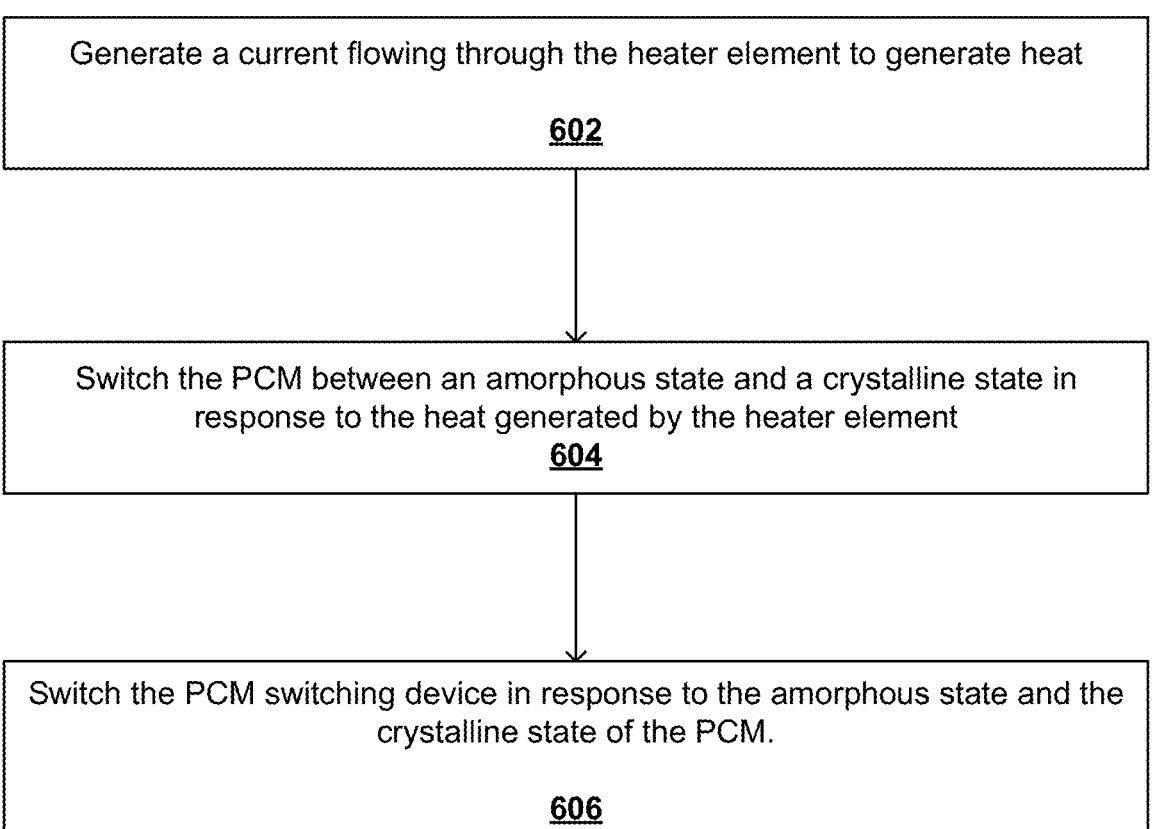
FIG. 6 is a flowchart diagram illustrating an example method for operating a PCM RF switch in accordance with some embodiments.

FIG. 6 is a flowchart diagram illustrating an example method 600 for operating a PCM RF switch in accordance with some embodiments. In the example shown in FIG. 6, the method 600 includes operations 602, 604, and 606. Additional operations may be performed.

At operation 602, a current flowing through the heater element 120C is generated, and heat is generated by the heater element 120C as a result. In one implementation, the current is generated by applying a bias at two ends (e.g., the heater pads 120A and 120B shown in FIG. 1A) of the heater element 120C.

At operation 604, the PCM of the PCM region 180 is switched between an amorphous state and a crystalline state in response to the heat generated by the heater element 120C. The amorphous state corresponds to a high resistance state. The crystalline state corresponds to a low resistance state.

At operation 606, the PCM switching device (e.g., the PCM RF switch 100 shown in FIG. 1) is switched between an on state and an off state in response to the amorphous state and the crystalline state of the PCM of the PCM region 180. The read path extending in the X-direction is created or cut off accordingly, which can be read from the voltage between the RF pads 110A and 110B.

In accordance with some aspects of the disclosure, a phase-change material (PCM) switching device is provided. The PCM switching device includes: a base dielectric layer over a semiconductor substrate; a heater element embedded in the base dielectric layer, the heater element comprising a first metal element and configured to generate heat in response to a current flowing therethrough; a self-aligned dielectric layer disposed on the heater element, wherein the self-aligned dielectric layer comprises one of an oxide of the first metal element and a nitride of the first metal element, and the self-aligned dielectric layer is horizontally aligned with the heater element; a PCM region disposed on the self-aligned dielectric layer, wherein the PCM region comprises a PCM operable to switch between an amorphous state and a crystalline state in response to the heat generated by the heater element; and two metal pads electrically connected to the PCM region.

In accordance with some aspects of the disclosure, a method of fabricating a phase-change material (PCM) switching device is provided. The method includes the following steps: providing a base dielectric layer; forming a heater element embedded in the base dielectric layer, the heater element comprising a first metal element and configured to generate heat in response to a current flowing therethrough; forming a self-aligned dielectric layer on the heater element, wherein the self-aligned dielectric layer comprises one of an oxide of the first metal element and a nitride of the first metal element, and the self-aligned dielectric layer is horizontally aligned with the heater element; forming a PCM region on the self-aligned dielectric layer, wherein the PCM region comprises a PCM operable to switch between an amorphous state and a crystalline state in response to the heat generated by the heater element; and forming two metal pads electrically connected to the PCM region.

In accordance with some aspects of the disclosure, a method of operating a phase-change material (PCM) switching device is provided. The PCM switching device includes: a base dielectric layer over a semiconductor substrate; a heater element embedded in the base dielectric layer, the heater element comprising a first metal element; a self-aligned dielectric layer disposed on the heater element, wherein the self-aligned dielectric layer comprises one of an oxide of the first metal element and a nitride of the first metal element, and the self-aligned dielectric layer is horizontally aligned with the heater element; a PCM region disposed on the self-aligned dielectric layer, wherein the PCM region comprises a PCM; and two metal pads electrically connected to the PCM region. The method includes the following steps: generating a current flowing through the heater element to generate heat; switching the PCM between an amorphous state and a crystalline state in response to the heat generated by the heater element; and switching the PCM switching device in response to the amorphous state and the crystalline state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a phase-change material (PCM) switching device, the method comprising:
   providing a base dielectric layer;

12 forming a heater element embedded in the base dielectric layer, the heater element comprising a first metal element and configured to generate heat in response to a current flowing therethrough;
forming a self-aligned dielectric layer on the heater element, wherein the self-aligned dielectric layer comprises one of an oxide of the first metal element and a nitride of the first metal element, and the self-aligned dielectric layer is horizontally aligned with the heater element;
forming a PCM region on the self-aligned dielectric layer, wherein the PCM region comprises a PCM operable to switch between an amorphous state and a crystalline state in response to the heat generated by the heater element; and
forming two metal pads electrically connected to the PCM region.

2. The method of claim 1, wherein the forming the self-aligned dielectric layer comprises:
   oxidizing a top portion of the heater element.
3. The method of claim 2, wherein the oxidizing comprising:
   performing an oxygen-containing plasma treatment process.
4. The method of claim 2, wherein the oxidizing comprising:
   performing a wet oxidation process.
5. The method of claim 1, wherein the forming the self-aligned dielectric layer comprises:
   nitriding a top portion of the heater element.
6. The method of claim 5, wherein the nitriding comprising:
   performing a nitrogen-containing plasma treatment process.
7. The method of claim 5, wherein the nitriding comprising:
   performing a wet nitridation process.
8. The method of claim 1, wherein the heater element comprises one of a group consisting of tungsten, titanium, aluminum, and tantalum.
9. A method of operating a phase-change material (PCM) switching device,
   the PCM switching device comprising:
      a base dielectric layer over a semiconductor substrate;
      a heater element embedded in the base dielectric layer, the heater element comprising a first metal element;
      a self-aligned dielectric layer disposed on and in contact with the heater element, wherein the self-aligned dielectric layer is formed by one of an oxidation and a nitridation of a top portion of the heater element and comprises one of an oxide of the first metal element and a nitride of the first metal element, and the self-aligned dielectric layer is horizontally aligned with the heater element;
      a PCM region disposed on the self-aligned dielectric layer, wherein the PCM region comprises a PCM; and
      two metal pads electrically connected to the PCM region;
   the method comprising:
      generating a current flowing through the heater element to generate heat;
      switching the PCM between an amorphous state and a crystalline state in response to the heat generated by the heater element; and
      switching the PCM switching device in response to the amorphous state and the crystalline state.

10. The method of claim 9, wherein the current flowing through the heater element is generated by applying a bias at two ends of the heater element.

11. The method of claim 9, wherein the heater element comprises one of a group consisting of tungsten, titanium, aluminum, and tantalum.

12. A method of fabricating a phase-change material (PCM) switching device, the method comprising:

providing a base dielectric layer;

forming a trench in the base dielectric layer;

forming a heater element in the trench, the heater element comprising a first metal element and configured to generate heat in response to a current flowing therethrough;

forming a self-aligned dielectric layer on the heater element, wherein the self-aligned dielectric layer comprises one of an oxide of the first metal element and a nitride of the first metal element, and the self-aligned dielectric layer is horizontally aligned with the heater element;

forming a PCM region on the self-aligned dielectric layer, wherein the PCM region comprises a PCM operable to switch between an amorphous state and a crystalline state in response to the heat generated by the heater element; and forming two metal pads electrically connected to the PCM region.

13. The method of claim 12, wherein the forming the self-aligned dielectric layer comprises:

oxidizing a top portion of the heater element.

14. The method of claim 13, wherein the oxidizing comprising:

performing an oxygen-containing plasma treatment process.

15. The method of claim 13, wherein the oxidizing comprising:

performing a wet oxidation process.

16. The method of claim 12, wherein the forming the self-aligned dielectric layer comprises:

nitriding a top portion of the heater element.

17. The method of claim 16, wherein the nitriding comprising:

performing a nitrogen-containing plasma treatment process.

18. The method of claim 16, wherein the nitriding comprising:

performing a wet nitridation process.

19. The method of claim 12, wherein the heater element comprises one of a group consisting of tungsten, titanium, aluminum, and tantalum.

20. The method of claim 12, further comprising:

performing a planarization process prior to forming the self-aligned dielectric layer on the heater element.

\* \* \* \* \*